United States Patent
Szczesny et al.

(10) Patent No.: US 8,670,236 B2
(45) Date of Patent: Mar. 11, 2014

(54) CAGE ASSEMBLY FOR RECEIVING A PLUGGABLE MODULE

(75) Inventors: David Szczesny, Hershey, PA (US); Michael Eugene Shirk, Grantvill, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 223 days.

(21) Appl. No.: 13/197,604

(22) Filed: Aug. 3, 2011

(65) Prior Publication Data

US 2013/0033821 A1 Feb. 7, 2013

(51) Int. Cl.
*H05K 7/20* (2006.01)
*H05K 9/00* (2006.01)

(52) U.S. Cl.
USPC .......... 361/704; 361/679.46; 361/679.54; 361/709; 361/715; 361/719; 361/816; 361/818; 165/80.3; 165/104.33; 174/50; 174/350; 174/358

(58) Field of Classification Search
USPC .......... 361/679.46, 679.54, 690–697, 361/704–715, 717–724, 800, 801, 816, 361/818; 165/80.3, 104.33, 185; 257/713, 257/718, 719; 385/92–94, 53, 88, 134; 398/141, 164, 135, 139; 439/567, 607, 439/608, 609, 910; 174/50, 50.52, 520, 174/17 R, 17.08, 35 R, 35 GS; 428/457
See application file for complete search history.

(56) References Cited

U.S. PATENT DOCUMENTS

| | | | | |
|---|---|---|---|---|
| 6,047,172 A | * | 4/2000 | Babineau et al. | 455/300 |
| 6,065,530 A | * | 5/2000 | Austin et al. | 165/80.3 |
| 6,255,581 B1 | * | 7/2001 | Reis et al. | 174/388 |
| 6,410,137 B1 | * | 6/2002 | Bunyan | 428/356 |
| 6,521,348 B2 | * | 2/2003 | Bunyan et al. | 428/457 |
| 6,716,536 B2 | * | 4/2004 | Bunyan et al. | 428/457 |
| 6,777,095 B2 | * | 8/2004 | Bunyan et al. | 428/457 |
| 6,816,376 B2 | | 11/2004 | Bright et al. | |
| 6,856,769 B1 | * | 2/2005 | Steffensen et al. | 398/135 |
| 6,980,437 B2 | | 12/2005 | Bright | |
| 7,001,217 B2 | | 2/2006 | Bright et al. | |
| 7,254,034 B2 | * | 8/2007 | Bolle et al. | 361/719 |
| 7,355,857 B2 | * | 4/2008 | Pirillis et al. | 361/715 |
| 7,405,931 B2 | * | 7/2008 | Saturley et al. | 361/679.48 |
| 7,438,596 B2 | | 10/2008 | Phillips | |
| 7,539,018 B2 | | 5/2009 | Murr et al. | |
| 7,625,223 B1 | * | 12/2009 | Fogg | 439/92 |
| 7,763,810 B2 | * | 7/2010 | van Haaster | 174/357 |
| 8,081,470 B2 | * | 12/2011 | Oki et al. | 361/715 |
| 2006/0180348 A1 | * | 8/2006 | Cloutier et al. | 174/350 |
| 2007/0183128 A1 | * | 8/2007 | Pirillis et al. | 361/715 |
| 2008/0137306 A1 | * | 6/2008 | Kim | 361/709 |
| 2009/0296351 A1 | * | 12/2009 | Oki et al. | 361/709 |

* cited by examiner

Primary Examiner — Michail V Datskovskiy

(57) ABSTRACT

A cage assembly is provided for receiving a pluggable module. The cage assembly includes a cage having a front end, a mounting side, and an internal compartment. The front end is open to the internal compartment of the cage. The internal compartment is configured to receive the pluggable module therein through the front end. A heat sink is mounted to the mounting side of the cage. The heat sink has a module side that is configured to thermally communicate with the pluggable module. An electromagnetic interference (EMI) gasket extends along at least a portion of an interface between the mounting side of the cage and the module side of the heat sink.

16 Claims, 8 Drawing Sheets

CAGE ASSEMBLY FOR RECEIVING A PLUGGABLE MODULE

BACKGROUND OF THE INVENTION

The subject matter described and/or illustrated herein relates generally to pluggable modules, and more particularly to cage assemblies for receiving pluggable modules.

Various types of fiber optic and copper based transceiver assemblies that permit communication between host equipment and external devices are known. These transceiver assemblies typically include a pluggable module that is received within a receptacle assembly, which includes a receptacle connector that pluggably connects to the pluggable module. The receptacle assembly typically includes a metal cage having an internal compartment that receives the pluggable module therein. The receptacle connector is held in internal compartment of the cage for connection with the pluggable module as the pluggable module is inserted therein. The pluggable modules are constructed according to various standards for size and compatibility, for example the Quad Small Form-factor Pluggable (QSFP) module standard and the XFP standard.

Due to increases in the density, power output levels, and/or switching speeds of some pluggable modules, there may be a corresponding increase in heat generated by the pluggable module. The heat generated by the operation of the pluggable modules can lead to significant problems. For example, some pluggable modules may lose performance, or outright fail, if the core temperature of the module rises too high. Known techniques used to control the temperature of pluggable modules include mounting a heat sink to the cage. When the pluggable module is received within the receptacle assembly, the heat sink thermally communicates (e.g., engages) with the pluggable module to dissipate heat from the module. But, electromagnetic interference (EMI) emissions may leak out of the receptacle assembly at an interface between the cage and the heat sink. EMI leakage out of the receptacle assembly may be especially problematic when the receptacle assembly does not hold a pluggable module. For example, the cage includes an opening that enables the externally-mounted heat sink to thermally communicate with the pluggable module through the cage. When the pluggable module is absent from the internal compartment of the cage, the opening exposes the interface between the cage and the heat sink to the internal compartment, which may increase the amount of EMI emissions leaking out from within the compartment.

BRIEF DESCRIPTION OF THE INVENTION

In one embodiment, a cage assembly is provided for receiving a pluggable module. The cage assembly includes a cage having a front end, a mounting side, and an internal compartment. The front end is open to the internal compartment of the cage. The internal compartment is configured to receive the pluggable module therein through the front end. A heat sink is mounted to the mounting side of the cage. The heat sink has a module side that is configured to thermally communicate with the pluggable module. An electromagnetic interference (EMI) gasket extends along at least a portion of an interface between the mounting side of the cage and the module side of the heat sink.

In another embodiment, a receptacle assembly is provided for mating with a pluggable module. The receptacle assembly includes a receptacle connector, and a cage having a front end, a mounting side, and an internal compartment. The front end is open to the internal compartment. The receptacle connector is held within the internal compartment. The internal compartment is configured to receive the pluggable module therein through the front end. A heat sink is mounted to the mounting side of the cage. The heat sink has a module side that is configured to thermally communicate with the pluggable module. An electromagnetic interference (EMI) gasket extends along at least a portion of an interface between the mounting side of the cage and the module side of the heat sink.

In another embodiment, a cage assembly is provided for receiving a pluggable module. The cage has a front end, a mounting side, and an internal compartment. The front end is open to the internal compartment of the cage. The internal compartment is configured to receive the pluggable module therein through the front end. The mounting side includes an opening extending therethrough. A heat sink is mounted to the mounting side of the cage at the opening. The heat sink has a module side that is configured to thermally communicate with the pluggable module. An electromagnetic interference (EMI) gasket is held between the mounting side of the cage and the module side of the heat sink.

DETAILED DESCRIPTION OF THE INVENTION

Figure 1:
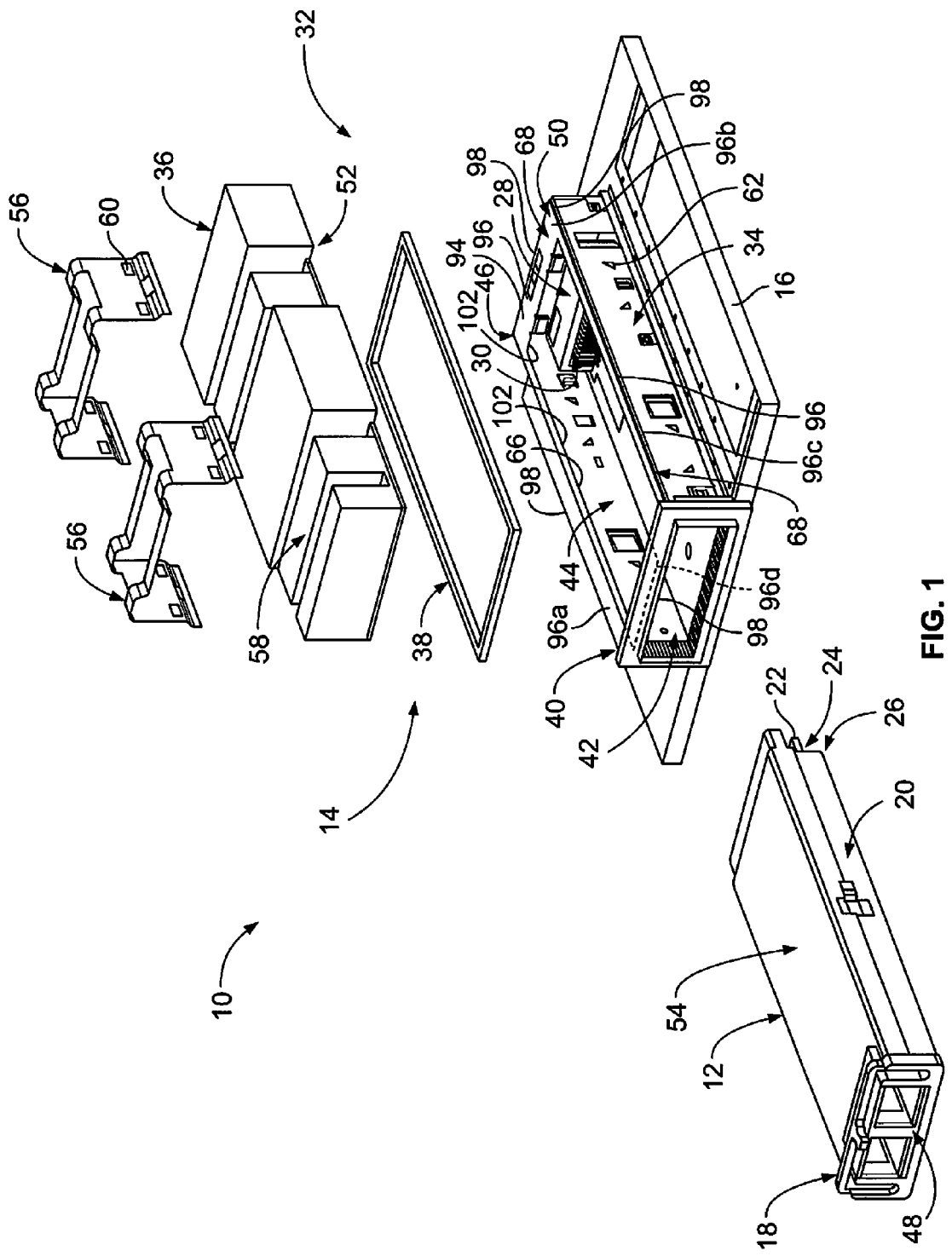
FIG. 1 is a partially exploded perspective view of an exemplary embodiment of a transceiver assembly.

FIG. 1 is a partially exploded perspective view of a portion of an exemplary embodiment of a transceiver assembly 10. In the exemplary embodiment, the transceiver assembly 10 is adapted to address, among other things, conveying data signals at high rates, such as data transmission rates of at least 10 gigabits per second (Gbps), which is required by the SFP+ standard. For example, in some embodiments the transceiver assembly 10 is adapted to convey data signals at a data transmission rate of at least 28 Gbps. Moreover, and for example, in some embodiments the transceiver assembly 10 is adapted to convey data signals at a data transmission rate of between approximately 20 Gbps and approximately 30 Gbps. It is appreciated, however, that the benefits and advantages of the subject matter described and/or illustrated herein may accrue equally to other data transmission rates and across a variety of systems and standards. In other words, the subject matter described and/or illustrated herein is not limited to data transmission rates of 10 Gbps or greater, any standard, or the exemplary type of transceiver assembly shown and described herein.

The transceiver assembly 10 includes one or more pluggable modules 12 configured for pluggable insertion into a receptacle assembly 14 that is mounted to a host circuit board 16. The host circuit board 16 may be mounted in a host system (not shown) such as, but not limited to, a router, a server, a computer, and/or the like. The host system typically includes a conductive chassis (not shown) having a panel (not shown) including one or more openings (not shown) extending therethrough in substantial alignment with the receptacle assembly 14. The receptacle assembly 14 is optionally electrically connected to the panel.

The pluggable module 12 is configured to be inserted into the receptacle assembly 14. Specifically, the pluggable module 12 is inserted into the receptacle assembly 14 through the panel opening such that a front end 18 of the pluggable module 12 extends outwardly from the receptacle assembly 14. The pluggable module 12 includes a housing 20 that forms a protective shell for a circuit board 22 that is disposed within the housing 20. The circuit board 22 carries circuitry, traces, paths, devices, and/or the like that perform transceiver functions in a known manner. An edge 24 of the circuit board 22 is exposed at a rear end 26 of the housing 20. In an exemplary embodiment, a straddle mount connector (not shown) is mounted to the circuit board 22 and exposed at the rear end 26 of the housing 20 for plugging into a receptacle connector 28 of the receptacle assembly 14. In alternative to the straddle mount connector, the circuit board 22 of the pluggable module 12 may directly mate with the receptacle connector 28. In other words, in some alternative embodiments, the edge 24 of the circuit board 22 of the pluggable module 12 is received within a receptacle 30 of the receptacle connector 28 to electrically connect the pluggable module 12 to the receptacle connector 28.

In general, the pluggable module 12 and the receptacle assembly 14 may be used in any application requiring an interface between a host system and electrical and/or optical signals. The pluggable module 12 interfaces to the host system via the receptacle connector 28 of the receptacle assembly 14, which includes the receptacle connector 28 and a cage assembly 32. The cage assembly 32 includes an electrically conductive cage 34 (which is sometimes referred to as a "receptacle guide frame" or a "guide frame"), a heat sink 36, and an electromagnetic interference (EMI) gasket 38. The cage 34 includes a front end 40 having one or more front openings, or ports, 42 that are open to one or more internal compartments 44 of the cage 34. The front end 40 of the cage 34 is configured to be mounted, or received, within the opening in the panel. The receptacle connector 28 is positioned within the internal compartment 44 at a rear end 46 of the cage 34. The internal compartment 44 of the cage 34 is configured to receive the pluggable module 12 therein in electrical connection with the receptacle connector 28. The cage 34 may include any number of internal compartments 44 and ports 42, arranged in any pattern, configuration, arrangement, and/or the like (such as, but not limited to, any number of rows and/or columns), for electrically connecting any number of pluggable modules 12 to the host circuit board.

The pluggable module 12 interfaces to one or more optical cables (not shown) and/or one or more electrical cables (not shown) through a connector interface 48 at the front end 18 of the module 12. Optionally, the connector interface 48 comprises a mechanism that cooperates with a fiber or cable assembly (not shown) to secure the fiber or cable assembly to the pluggable module 12. Suitable connector interfaces 48 are known and include adapters for the LC style fiber connectors and the MTP/MPO style fiber connectors offered by Tyco Electronics Corporation (Harrisburg, Pa.).

The heat sink 36 is mounted to the cage 34. More specifically, the heat sink 36 is mounted to a mounting side 50 of the cage 34. When the pluggable module 12 is received within the internal compartment 44 of the cage 34, a module side 52 of the heat sink 36 thermally communicates with the pluggable module 12. Heat generated by the pluggable module 12 is dissipated by the heat sink 36 via the thermal communication between the heat sink 36 and the pluggable module 12. The cage 34 includes an opening 66 that extends through an upper wall 68 of the cage 34 that includes the mounting side 50. The opening 66 thereby extends through the mounting side 50. The heat sink 36 is mounted to mounting side 50 of the cage 34 at the opening 66 such that the opening 66 enables the heat sink 36 to thermally communicate with the pluggable module 12.

In an exemplary embodiment, the heat sink 36 thermally communicates with the pluggable module 12 via engagement of the heat sink 36 with the pluggable module 12. More specifically, the module side 52 of the heat sink 36 engages a side 54 of the housing 20 of the pluggable module 12 to thermally communicate the heat sink 36 with the pluggable module 12. In some alternative embodiments, the module side 52 of the heat sink 36 thermally communicates with the pluggable module 12 via a thermal interface material (not shown) that is positioned between, and engaged with each of, the module side 52 of the heat sink 36 and the side 54 of the pluggable module 12. The thermal interface material may increase the thermal transfer efficiency between the pluggable module 12 and the heat sink 36.

As can be seen in FIG. 1, the heat sink 36 is mounted to the cage 34 using one or more mounting clips 56 that extend over a side 58 of the heat sink 36 and engage the cage 34. The mounting clips 56 include one or more mounting features 60 that cooperate with one or more complementary mounting features 62 of the cage 34 using a snap-fit connection to hold the heat sink 36 to the cage 34. In addition or alternative to the mounting clips 56, the mounting features 60, the mounting features 62, and/or the snap-fit connection, the heat sink 36 may be mounted to cage 34 using any other structure, means, fasteners, and/or the like, such as, but not limited to, using a threaded fastener, another type of non-threaded fastener, an interference fit, a latch, and/or the like.

As will be described in more detail below, the EMI gasket 38 extends along at least a portion of an interface 64 (FIGS. 5, 6, and 8) between the mounting side 50 of the cage 34 and the module side 52 of the heat sink 36. The EMI gasket 38 is positioned to facilitate blocking EMI leakage at the interface 64. As can be seen in FIG. 1, the EMI gasket 38 is a component of the transceiver assembly 10 that is separate and discrete from both the heat sink 36 and the cage 34.

Figure 2:
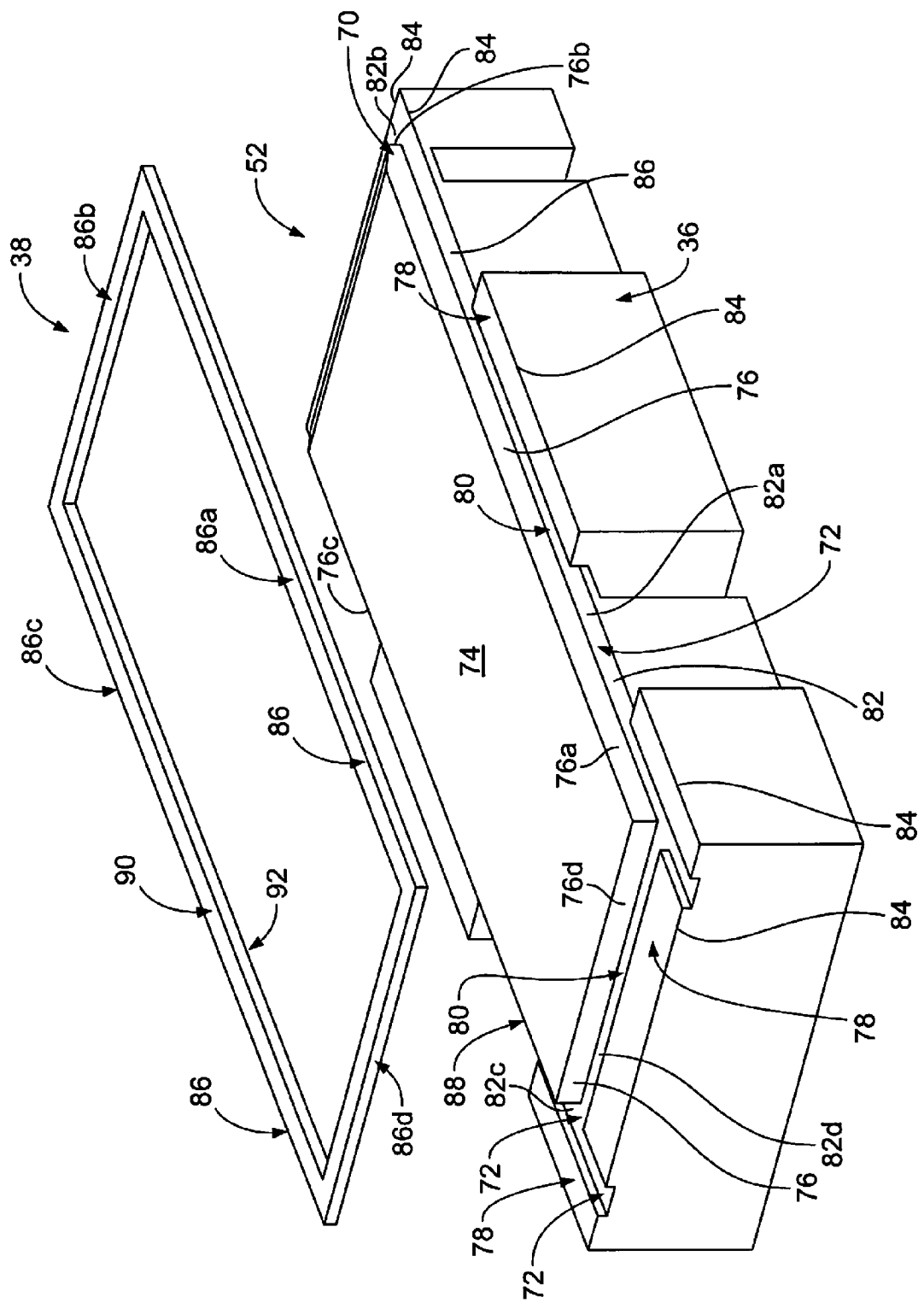
FIG. 2 is an exploded perspective view illustrating exemplary embodiments of a heat sink and an electromagnetic interference (EMI) gasket of the transceiver assembly shown in FIG. 1.

FIG. 2 is an exploded perspective view illustrating the heat sink 36 and the EMI gasket 38. FIG. 2 illustrates the module side 52 of the heat sink 36. The module side 52 of the heat sink 36 includes a platform 70. The platform 70 extends outwardly on the module side 52 from a surface 72 of the module side 52 to a module surface 74 of the platform 70. Side walls 76 of the platform 70 extend from the surface 72 to the module surface 74. The side walls 76 define a circumference 88 of the platform 70. As will be described below, in an exemplary embodiment, the platform 70 of the heat sink 36 extends into the opening 66 (FIGS. 1 and 5) of the cage 34 (FIGS. 1 and 4-8) for thermally communicating with the pluggable module 12. In an exemplary embodiment, the module surface 74 of the platform 70 is configured to thermally communicate with the pluggable module 12 (FIGS. 1 and 7). For example, the module surface 74 of the platform 70 may be configured to engage the side 54 (FIG. 1) of the housing 20 (FIG. 1) of the pluggable module 12 to thermally communicate the heat sink 36 with the pluggable module 12. Moreover, and for example, the module surface 74 alternatively may be configured to engage a thermal interface material (not shown) that also engages the side 54 of the pluggable module 12. The surface 72 may be referred to herein as a "sink surface".

The module side 52 of the heat sink 36 includes optional projections 78 that extend outwardly relative to the surface 72. An optional gasket groove 80 is defined between the projections 78 and the side walls 76 of the platform 70. The gasket groove 80 is configured to receive the EMI gasket 38 therein. The surface 72 of the module side 52 includes segments 82 that define a bottom of the gasket groove 80. As can be seen in FIG. 2, at least portions of three of the segments 82*a*, 82*b*, and 82*c* extend proximate (e.g., intersect) a circumferential edge 84 of the module side 52. As will be described in more detail below, the segments 82 define portions of the interface 64 (FIGS. 5, 6, and 8) between the mounting side 50 (FIGS. 1 and 4-8) of the cage 34 and the module side 52 of the heat sink 36.

In an exemplary embodiment, the platform 70 includes four side walls 76*a*, 76*b*, 76*c*, and 76*d*, such that the platform 70 generally has the overall shape of a parallelepiped. But, the platform 70 may include any number of side walls 76 that provides the platform 70 with any other overall shape, which may or may not be complementary with the shape of the opening 66 within the cage 34. An exemplary embodiment of the gasket groove 80 generally follows a rectangular path along the module side 52. But, the gasket groove 80 may follow any other shaped path, which may or may not be complementary with the shape of the EMI gasket 38. While the surface 72 of the module side 52 of the heat sink 36 includes four segments 82*a*, 82*b*, 82*c*, and 82*d* in an exemplary embodiment, the surface 72 may include any number of segments 82 arranged in any other shape than is shown herein, wherein such other shape may or may not be complementary with the shape of the EMI gasket 38 and/or the cage 34.

The EMI gasket 38 includes opposite sides 90 and 92. The side 90 is configured to engage the mounting side 50 (FIGS. 1 and 4-8) of the cage 34, while the side 92 is configured to engage the surface 72 of the module side 52 of the heat sink 36. In an exemplary embodiment, the EMI gasket 38 includes four segments 86, namely the segments 86*a*, 86*b*, 86*c*, and 86*d*. The segments 86*a*, 86*b*, 86*c*, and 86*d* define a single continuous structure in an exemplary embodiment. Alternatively, one or more segments 86*a*, 86*b*, 86*c*, and/or 86*d* is separate and distinct from one or more other segments 86*a*, 86*b*, 86*c*, and/or 86*d*. As used herein, a segment 86 is "separate and distinct" from another segment 86 if the segments 86 do not form a continuous structure. Segments 86 that are separate and distinct from each other may engage each other and/or be mechanically connected together with a suitable fastener (e.g., an adhesive, a clip, and/or the like) when the EMI gasket 38 is positioned along the interface 64. The sides 90 and 92 may be referred to herein as a "cage side" and a "sink side", respectively.

As shown herein, the EMI gasket 38 generally has a rectangular shape, which is defined by the four segments 86*a*, 86*b*, 86*c*, and 86*d*. But, the EMI gasket 38 may include any other shape, whether or not the shape of the EMI gasket 38 is complementary with the path of the gasket groove 80 and/or the shape of the platform 70. Moreover, the EMI gasket 38 may include any other number of segments 86 besides four.

The EMI gasket 38 may be fabricated from any materials and may have any construction. Optionally, at least a portion of the EMI gasket 38 is electrically conductive. The EMI gasket 38 is optionally configured to be resiliently compressible. One example of a construction of the EMI gasket 38 includes an internal foam core that is at least partially surrounded by an electrically conductive fabric.

Figure 3:
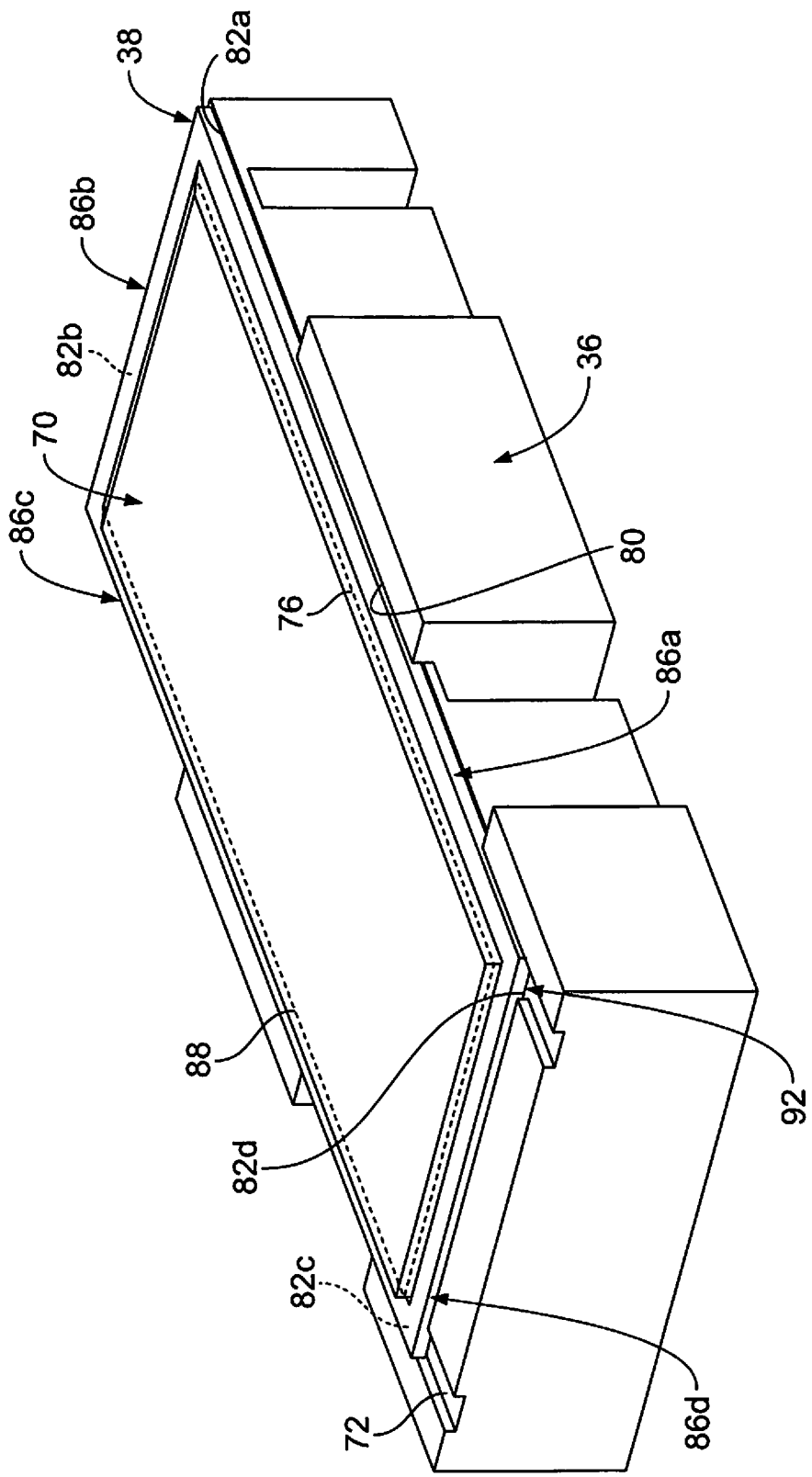
FIG. 3 is a perspective view illustrating the EMI gasket shown in FIG. 2 mounted to the heat sink shown in FIG. 2.

FIG. 3 is a perspective view illustrating the EMI gasket 38 mounted to the heat sink 36. The EMI gasket 38 is received within the gasket groove 80 of the heat sink 36. The side 92 of the EMI gasket 38 is engaged with the surface 72 of the heat sink 36. More specifically, at the side 92, the segments 86*a*, 86*b*, 86*c*, and 86*d* of the EMI gasket 38 are engaged with the segments 82*a*, 82*b*, 82*c*, and 82*d*, respectively, of the surface 72. The EMI gasket 38 extends around the circumference 88 of the platform 70. As can be seen in FIG. 3, in an exemplary embodiment, the EMI gasket 38 extends around an entirety of the circumference 88 of the platform 70. But, the EMI gasket 38 alternatively may extend around only a portion of the circumference 88 of the platform 70. Optionally, the EMI gasket 38 is engaged with the side walls 76 of the platform 70.

The EMI gasket 38 is optionally mechanically connected to the heat sink 36 using a fastener, such as, but not limited to, an adhesive and/or the like. Optionally, the EMI gasket 38 is mechanically connected to the heat sink 36 via an interference fit and/or snap-fit with the side walls 76 of the platform 70 in addition or alternative to the fastener. The mechanical connection between the EMI gasket 38 and the heat sink 36 optionally also electrically connects the EMI gasket 38 to the heat sink 36. One example of mechanically and electrically connecting the EMI gasket 38 to the heat sink 36 includes using an electrically conductive adhesive (e.g., an electrically conductive epoxy) bonded between the EMI gasket 38 and the surface 72 and/or side walls 76. Mechanically connecting the EMI gasket 38 to the heat sink 36 using the fastener and/or an interference and/or snap-fit connection is optional. For example, in some embodiments, the EMI gasket 38 is merely engaged with the heat sink 36.

Referring again to FIG. 1, the upper wall 68 of the cage 34 includes a surface 94 that defines the mounting side 50 of the cage 34. The surface 94 of the mounting side 50 includes segments 96 that extend proximate (e.g., intersect) a circumferential edge 98 of the mounting side 50. Namely, the surface 94 includes the segments 96*a*, 96*b*, 96*c*, and 96*d*. As will be described in more detail below, the segments 96 define portions of the interface 64 (FIGS. 5, 6, and 8) between the mounting side 50 of the cage 34 and the module side 52 of the heat sink 36. While the surface 94 includes four segments 96*a*, 96*b*, 96*c*, and 96*d* in an exemplary embodiment, the surface 94 may include any number of segments 96 arranged in any other shape than is shown herein, wherein such other shape may or may not be complementary with the shape of the EMI gasket 38 and/or the heat sink 36. The surface 94 may be referred to herein as a "cage surface".

Figure 4:
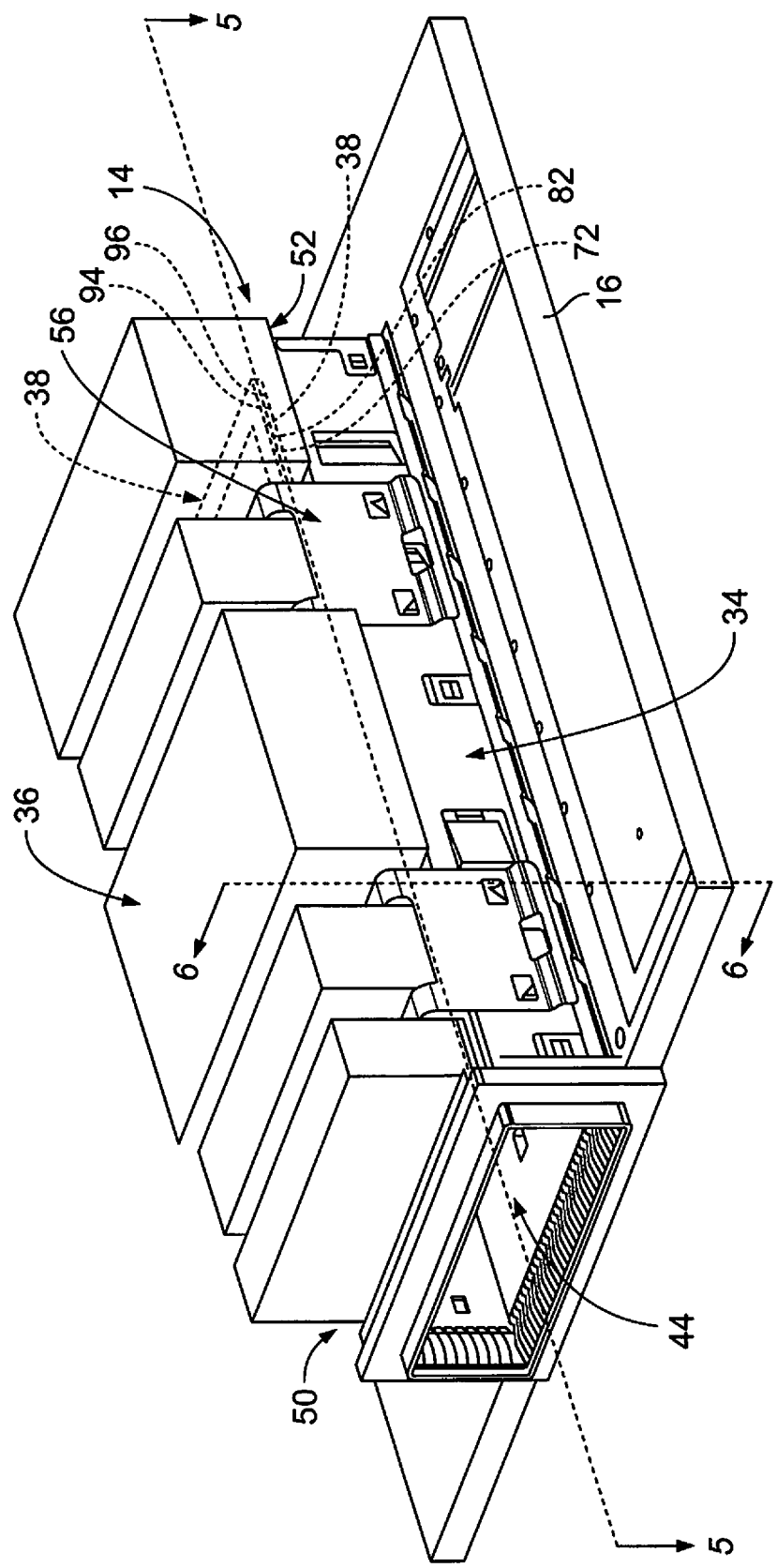
FIG. 4 is a perspective view of a portion the transceiver assembly shown in FIG. 1.

FIG. 4 is a perspective view illustrating the receptacle assembly 14 mounted on the host circuit board 16. The pluggable module 12 has been omitted from FIG. 4. FIG. 4 is an assembled view of the receptacle assembly 14 and the host circuit board 16 that illustrates the receptacle assembly 14 in a state wherein the pluggable module 12 is not mated therewith (i.e., not received or held within the internal compartment 44). The heat sink 36 is mounted to the mounting side 50 of the cage 34 using the mounting clips 56. Although not visible in FIG. 4, the platform 70 (FIGS. 2 and 3) extends through the opening 66 (FIGS. 1 and 5) within the mounting side 50 of the cage 34 and into the internal compartment 44. The module side 52 of the heat sink 36 faces the mounting side 50 of the cage 34, such that the surface 72 of the heat sink 36 faces the surface 94 of the cage 34. The segments 82 of the sink surface 72 face, and are at least partially aligned with, the corresponding segments 96 of the cage surface 94.

The EMI gasket 38 is held between the mounting side 50 of the cage 34 and the module side 52 of the heat sink 36. The heat sink 36 is seated on and engaged with the EMI gasket 38. In some embodiments, the EMI gasket 38 is mounted to the heat sink 36 before the heat sink 36 is mounted to the cage 34. For example, the EMI gasket 38 may be mechanically connected to the heat sink 36 (e.g., as described above) or may be held on the heat sink 36 by a person and/or machine before the heat sink 36 is mounted to the cage 34. In other embodiments, the EMI gasket 38 is first positioned on the cage 34 and the heat sink 36 is thereafter mounted to the cage 34. The EMI gasket 38 is optionally mechanically connected to the mounting side 50 of the cage 34, for example as described above with respect to the optional mechanical connection of the EMI gasket 38 to the heat sink 36.

Figure 5:
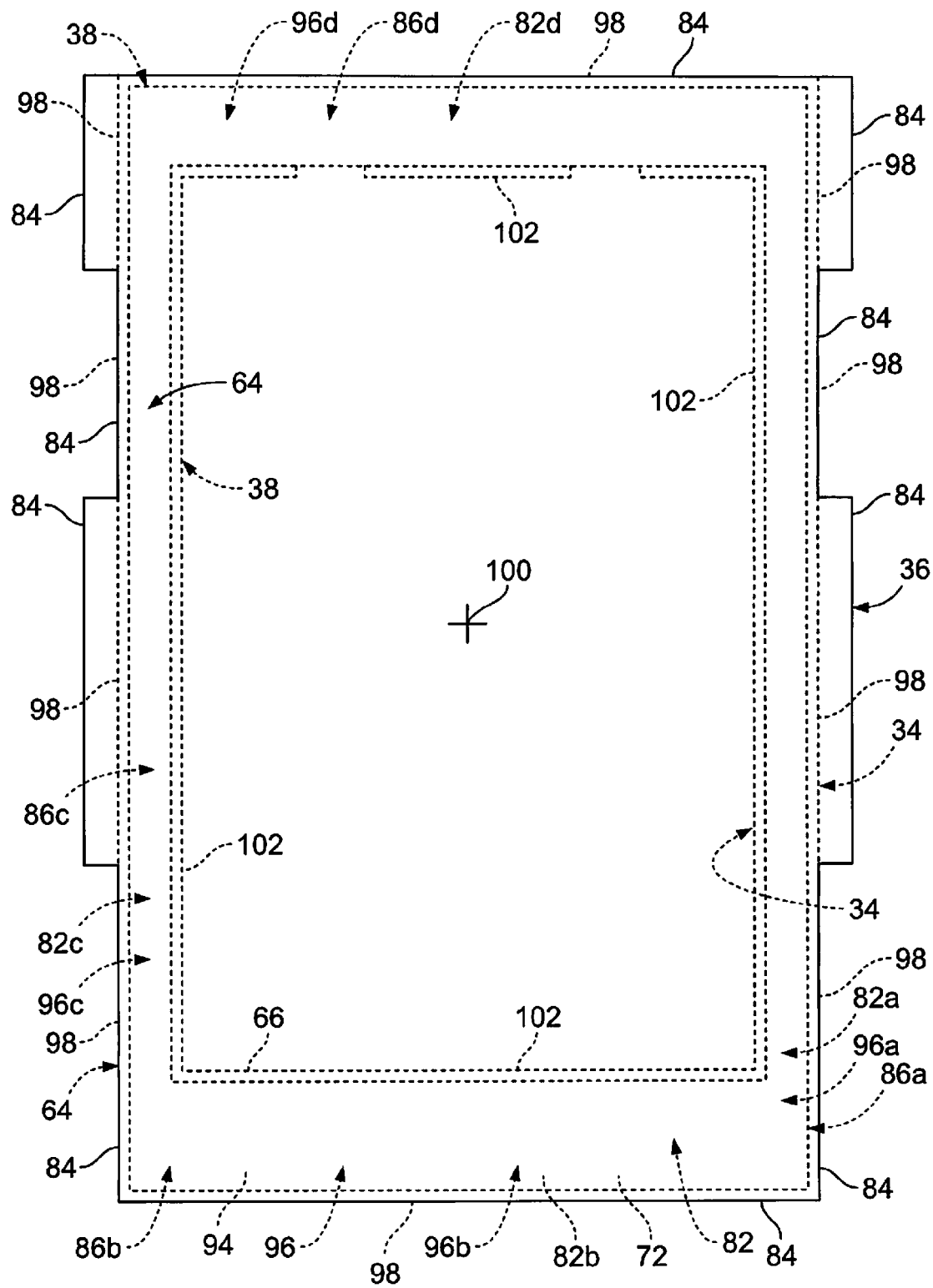
FIG. 5 is a cross-sectional view taken along line 5-5 of FIG. 4 illustrating the EMI gasket shown in FIG. 2 held between the heat sink shown in FIG. 2 and an exemplary embodiment of a cage of the transceiver assembly shown in FIG. 1.
Figure 6:
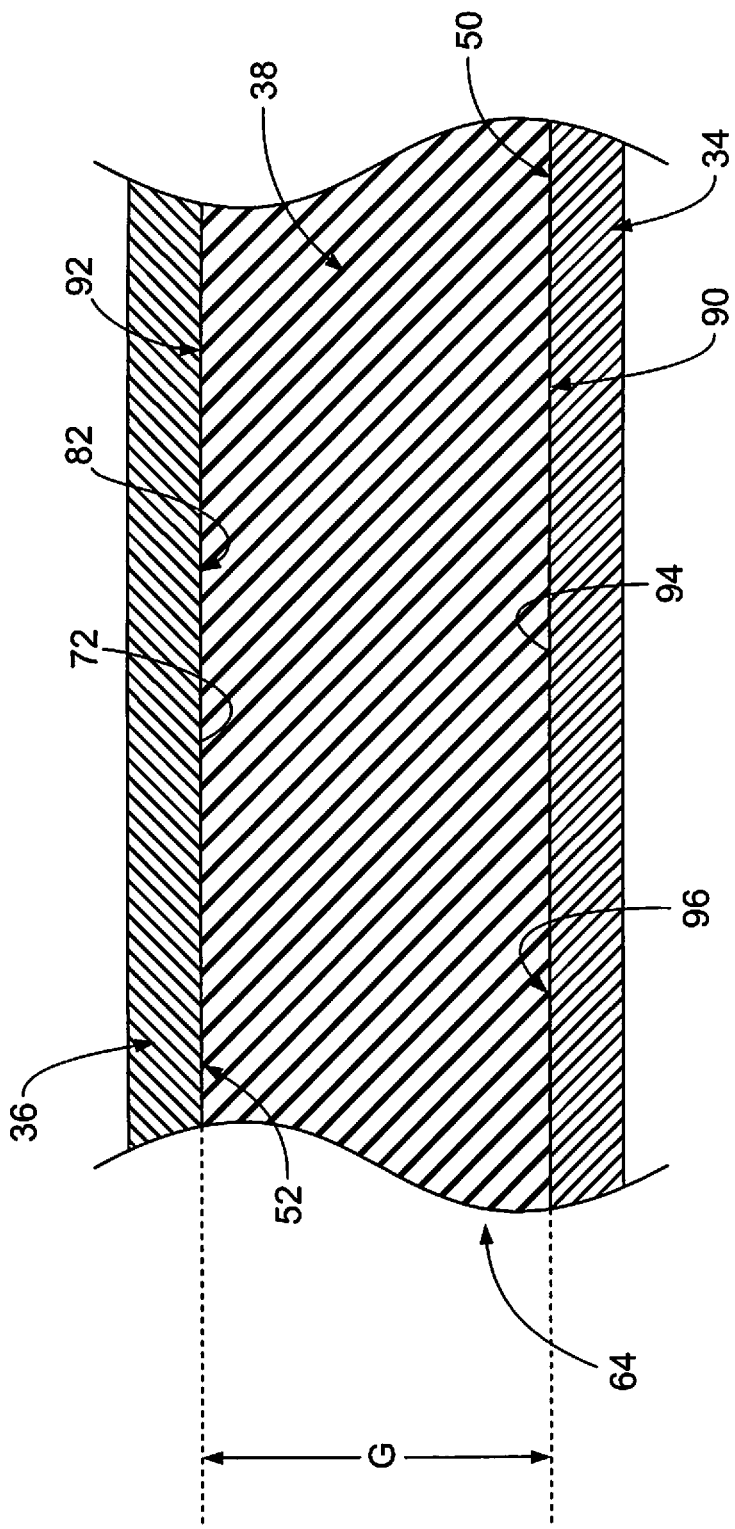
FIG. 6 is a cross-sectional view taken along line 6-6 of FIG. 4 and also illustrating the EMI gasket shown in FIG. 2 held between the heat sink shown in FIG. 2 and the cage.
Figure 7:
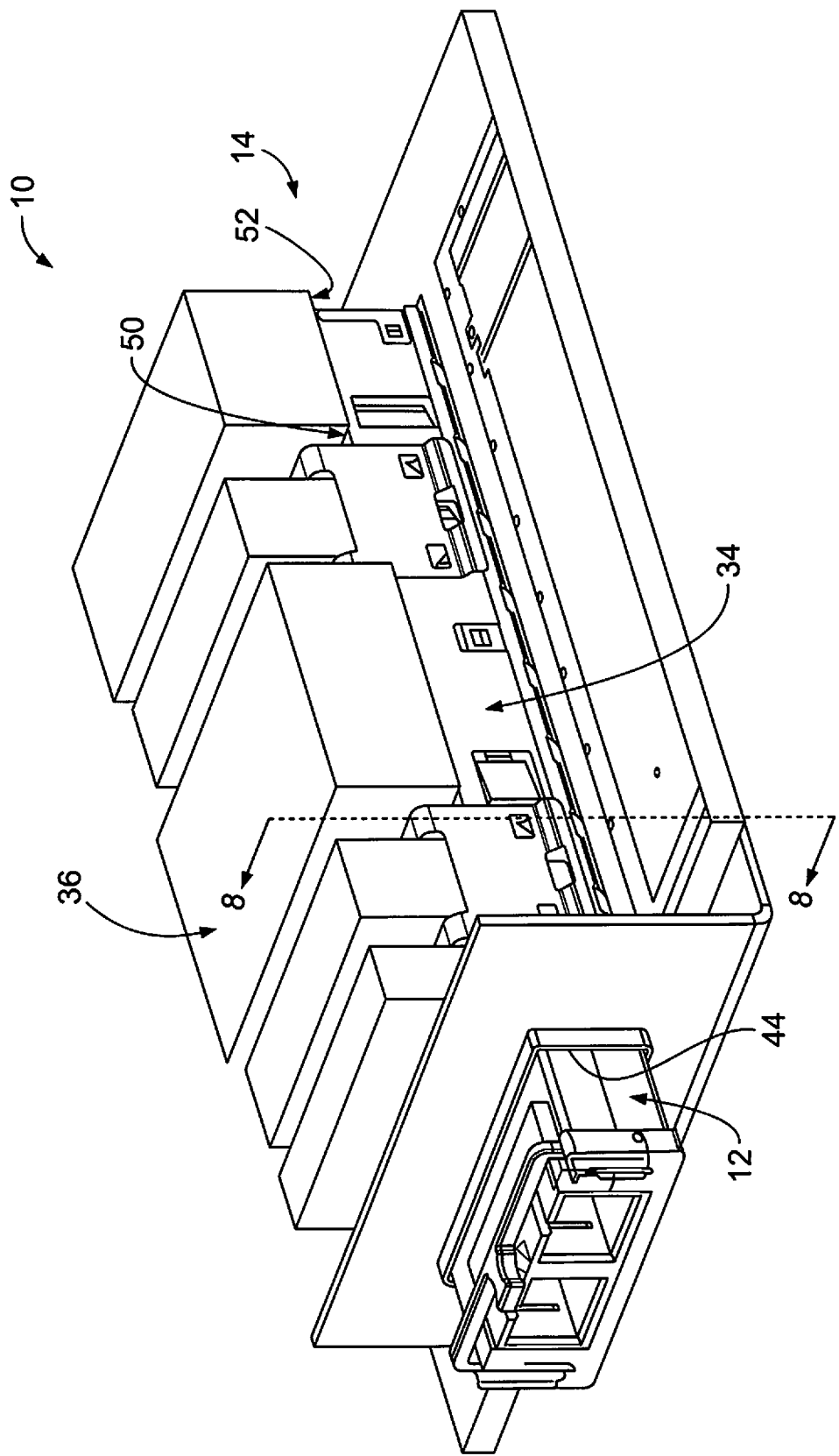
FIG. 7 is a perspective view of the transceiver assembly shown in FIG. 1.

FIGS. 5 and 6 are cross-sectional views taken along respective lines 5-5 and 6-6 of FIG. 4. FIGS. 5 and 6 illustrate the EMI gasket 38 as held between the mounting side 50 (not labeled in FIG. 5) of the cage 34 and the module side 52 (not labeled in FIG. 5) of the heat sink 36 when the receptacle assembly 14 is not mated with the pluggable module 12 (FIGS. 1 and 7). The interface 64 between the mounting side 50 of the cage 34 and the module side 52 of the heat sink 36 is defined from the segments 82 of the sink surface 72 to the corresponding segments 96 of the cage surface 94. In other words, the interface 64 is defined between the segments 82 and the corresponding segments 96.

As can be seen in FIG. 5, the segments 82a, 82b, 82c, and 82d face and are aligned with the respective segments 96a, 96b, 96c, and 96d. The interface 64 follows a path that has a radially (e.g., relative to a central axis 100) outer boundary defined by the circumferential edge 84 and/or 98 (which may or may not be aligned), and that has a radially inner boundary defined by an interior edge 102 (also labeled in FIG. 1) that defines the opening 66 of the cage 34. The interface 64 thus extends around the opening 66. In an exemplary embodiment, the interface 64 generally follows a rectangular path, but the interface 64 may follow any other shaped path, which may or may not be complementary with the shape of the EMI gasket 38, the cage 34, and/or the heat sink 36.

As can be seen in FIG. 6, the EMI gasket 38 is held between the mounting side 50 of the cage 34 and the module side 52 of the heat sink 36. The sides 90 and 92 of the EMI gasket 38 are engaged with the respective sides 50 and 52 of the cage 34 and heat sink 36, respectively, when the receptacle assembly 14 is not mated with the pluggable module 12 (FIGS. 1 and 7). More specifically, the side 90 of the EMI gasket 38 is engaged with the cage surface 94 of the mounting side 50, while the side 92 is engaged with the sink surface 72 of the module side 52. The interface 64 includes a gap G between the mounting side 50 of the cage 34 and the module side 52 of the heat sink 36. More specifically, the gap G extends from the segments 82 of the sink surface 72 to the corresponding segments 96 of the cage surface 94. Optionally, the EMI gasket 38 is compressed between the sides 50 and 52 when the receptacle assembly 14 is not mated with the pluggable module 12. The EMI gasket 38 may be compressed by any amount.

Referring again to FIG. 5, the EMI gasket 38 extends along the interface 64. More specifically, the segments 86a, 86b, 86c, and 86d of the EMI gasket 38 extend along the respective segments 82a, 82b, 82c, and 82d of the heat sink 36 and along the respective segments 96a, 96b, 96c, and 96d of the cage 34. EMI gasket 38 extends along the radially inner and outer boundaries of the interface 64. In an exemplary embodiment, the EMI gasket 38 extends along an entirety of the path of the interface 64, but the EMI gasket 38 alternatively may extend along only one or more portions of the path of the interface 64.

In an exemplary embodiment, the EMI gasket 38 extends along the interface 64 within the interface 64. In other words, the EMI gasket 38 extends along the interface 64 between the radially inner and radially outer boundaries of the interface 64. In some embodiments, all or a portion of the EMI gasket 38 extends along the interface 64 outside the interface 64 (i.e., radially outside the radially outer boundary of the interface 64). Moreover, in some embodiments, all or a portion of the EMI gasket 38 extends along the interface 64 inside the interface 64 (i.e., radially inside the radially inner boundary of the interface 64).

The EMI gasket 38 facilitates blocking EMI emissions from leaking out from the interior compartment 44 of the cage 34 through the interface 64. More specifically, EMI gasket 38 facilitates blocking EMI emissions from leaking out from the interior compartment 44 (FIGS. 1, 4, and 7) between the surface 72 of the heat sink 36 and the surface 94 of the cage 34.

FIG. 7 is a perspective view of the transceiver assembly 10 illustrating the receptacle assembly 14 in a state wherein the pluggable module 12 is mated therewith (i.e., is received and held within the internal compartment 44). As the pluggable module 12 is inserted into the internal compartment 44 of the cage 34, engagement between the module 12 and the platform 70 (FIGS. 2 and 3) of the heat sink 36 moves the heat sink 36 such that the module side 52 of the heat sink 36 moves in a direction away from the mounting side 50 of the cage 34. In embodiments wherein the heat sink 36 and the pluggable module 12 thermally communicate via a thermal interface material, engagement of the thermal interface material with the module 12 or the heat sink 36 may cause the movement of the heat sink 36 relative to the cage 34.

Figure 8:
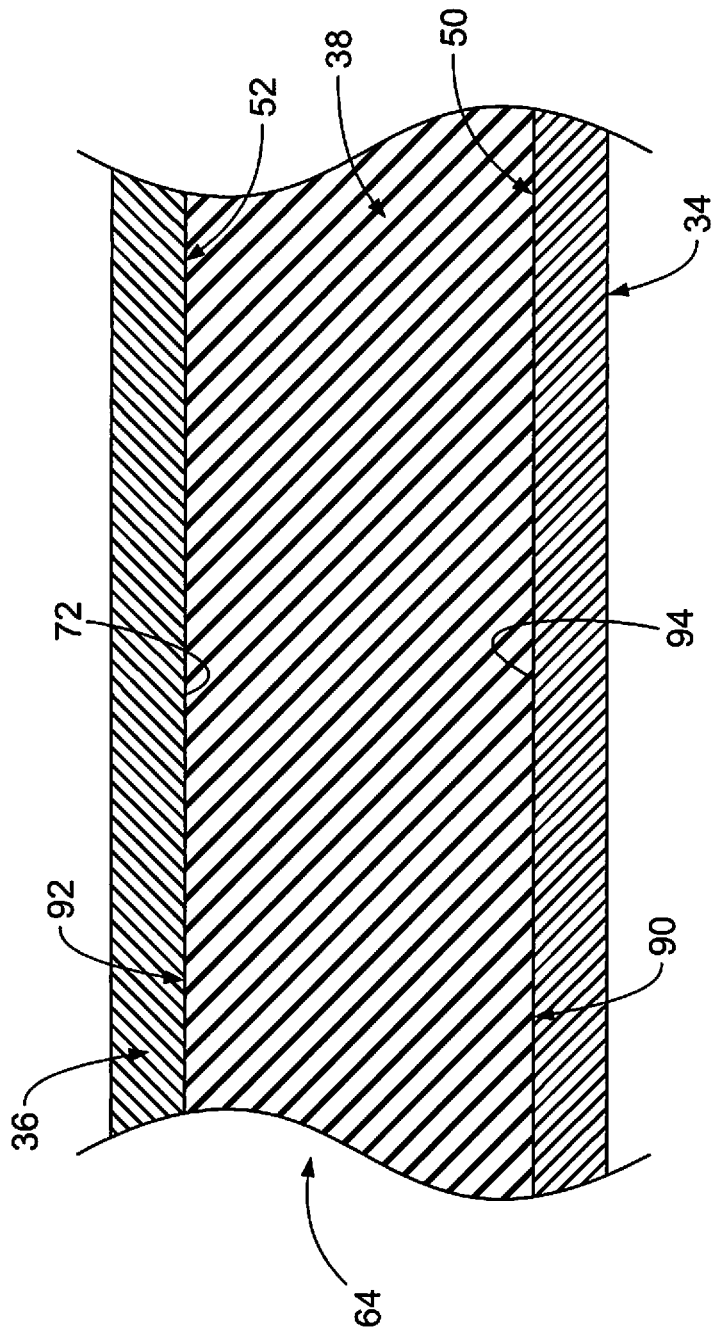
FIG. 8 is a cross-sectional view taken along line 8-8 of FIG. 7.

FIG. 8 is a cross-sectional view taken along line 8-8 of FIG. 7. When the pluggable module 12 (FIGS. 1 and 7) is mated with the receptacle assembly 14, the EMI gasket 38 is held between the mounting side 50 of the cage 34 and the module side 52 of the heat sink 36. The movement of the heat sink 36 relative to the cage 34 causes the EMI gasket 38 to at least partially uncompress by any amount. Optionally, the side 90 of the EMI gasket 38 is engaged with the surface 94 of the cage 34 when the pluggable module 12 is mated with the receptacle assembly 14. As should be apparent from the above description as well as the Figures, when the pluggable module 12 is mated with the receptacle assembly 14, the EMI gasket 38 extends along the interface 64 in a substantially similar manner to that described above when the pluggable module 12 is not mated with the receptacle assembly 14.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cage assembly for receiving a pluggable module, the cage assembly comprising:
    a cage having a front end, a mounting side, and an internal compartment, the front end being open to the internal compartment of the cage, the internal compartment being configured to receive the pluggable module therein through the front end; and
    a heat sink mounted to the mounting side of the cage, the heat sink having a module side that is configured to thermally communicate with the pluggable module, the module side of the heat sink comprising a platform; and
    an electromagnetic interference (EMI) gasket extending along at least a portion of an interface between the mounting side of the cage and the module side of the heat sink, wherein the EMI gasket is mechanically connected to the heat sink via at least one of an interference fit or a snap-fit with the platform of the module side of the heat sink.

2. The assembly of claim 1, wherein the EMI gasket is separate and discrete from the heat sink and from the cage, the EMI gasket being positioned to block EMI leakage at the interface between the mounting side of the cage and the module side of the heat sink.

3. The assembly of claim 1, wherein the EMI gasket comprises a cage side that is engaged with the mounting side of the cage and a sink side that is engaged with the module side of the heat sink.

4. The assembly of claim 1, wherein the heat sink is seated on, and directly engages, the EMI gasket.

5. The assembly of claim 1, wherein the EMI gasket is resiliently compressible between the mounting side of the cage and the module side of the heat sink.

6. The assembly of claim 1, wherein the EMI gasket is compressed between the mounting side of the cage and the module side of the heat sink when the internal compartment of the cage does not hold the pluggable module therein.

7. The assembly of claim 1, wherein the mounting side of the cage comprises an opening extending therethrough, the interface between the module side of the heat sink and the mounting side of the cage extending around the opening, the platform of the module side of the heat sink extending into the opening, the platform having a module surface that is configured to thermally communicate with the pluggable module, the EMI gasket extending along the interface around at least a portion of a circumference of the platform.

8. The assembly of claim 1, wherein the EMI gasket extends along at least a portion of the interface between the mounting side of the cage and the module side of the heat sink at least one of:
    within the interface;
    outside the interface; or
    radially inside the interface.

9. The assembly of claim 1, wherein the interface between the mounting side of the cage and the module side of the heat sink comprises a cage surface of the mounting side of the cage that extends proximate a circumferential edge of the mounting side, the interface comprising a sink surface of the module side of the heat sink that extends proximate a circumferential edge of the module side, the cage surface of the cage facing the sink surface of the heat sink.

10. The assembly of claim 1, wherein the EMI gasket is attached to the module side of the heat sink using an electrically conductive epoxy.

11. The assembly of claim 1, wherein the interface between the mounting side of the cage and the module side of the heat sink comprises a gap between the mounting and module sides.

12. The assembly of claim 1, wherein the module side of the heat sink is configured to thermally communicate with the pluggable module via one of:
    engagement with the pluggable module; or
    engagement with a thermal interface material (TIM) that is positioned between the module side of the heat sink and the pluggable module and is engaged with the pluggable module.

13. A receptacle assembly for mating with a pluggable module, the receptacle assembly comprising:
    a receptacle connector; and
    a cage having a front end, a mounting side, and an internal compartment, the front end being open to the internal compartment, the receptacle connector being held within the internal compartment, the internal compartment being configured to receive the pluggable module therein through the front end;
    a heat sink mounted to the mounting side of the cage, the heat sink having a module side that is configured to thermally communicate with the pluggable module, the module side comprising a platform and a gasket groove that is at least partially defined by a side wall of the platform; and
    an electromagnetic interference (EMI) gasket extending along at least a portion of an interface between the mounting side of the cage and the module side of the heat sink, the EMI gasket being received within the gasket groove.

14. The assembly of claim 13, wherein the mounting side of the cage comprises an opening extending therethrough, the interface between the module side of the heat sink and the mounting side of the cage extending around the opening, the module side of the heat sink comprising a platform that extends into the opening, the platform having a module surface that is configured to thermally communicate with the pluggable module, the EMI gasket extending along the interface around at least a portion of a circumference of the platform.

15. The assembly of claim 13, wherein the interface between the mounting side of the cage and the module side of the heat sink comprises a gap between the mounting and module sides.

16. The assembly of claim 13, wherein a bottom of the gasket groove intersects a circumferential edge of the module side of the heat sink.

* * * * *